(12) United States Patent
Züger

(10) Patent No.: US 12,577,671 B2
(45) Date of Patent: Mar. 17, 2026

(54) ARC-BEAM POSITION MONITORING AND POSITION CONTROL IN PICVD COATING SYSTEMS

(71) Applicant: Oerlikon Surface Solutions AG, Pfäffikon, Pfäffikon (CH)

(72) Inventor: Othmar Züger, Triesen (LI)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 49 days.

(21) Appl. No.: 18/264,619

(22) PCT Filed: Feb. 9, 2022

(86) PCT No.: PCT/EP2022/053164
§ 371 (c)(1),
(2) Date: Aug. 8, 2023

(87) PCT Pub. No.: WO2022/171697
PCT Pub. Date: Aug. 18, 2022

(65) Prior Publication Data
US 2024/0117493 A1 Apr. 11, 2024

Related U.S. Application Data

(60) Provisional application No. 63/147,341, filed on Feb. 9, 2021, provisional application No. 63/147,345, filed on Feb. 9, 2021.

(51) Int. Cl.
*C23C 16/513* (2006.01)
*C23C 16/52* (2006.01)
*H01J 37/32* (2006.01)

(52) U.S. Cl.
CPC ............ *C23C 16/513* (2013.01); *C23C 16/52* (2013.01); *H01J 37/32064* (2013.01); *H01J 37/32669* (2013.01)

(58) Field of Classification Search
CPC ..... C23C 16/513; C23C 16/52; C23C 16/517; H01J 37/32064; H01J 37/32669; H01J 37/32935; H01J 37/32055; H05H 1/24
See application file for complete search history.

(56) References Cited

U.S. PATENT DOCUMENTS 5,478,608 A * 12/1995 Gorokhovsky ....... C23C 16/503
427/571
5,753,045 A 5/1998 Karner et al.
(Continued)

FOREIGN PATENT DOCUMENTS

WO 03031675 A2 4/2003

OTHER PUBLICATIONS

Balzers Operating Manual BAI 730 D Diamond Coating System, BD 802 633 BE, 5th Edition, Apr. 2004, p. 20.
(Continued)

*Primary Examiner* — Dah-Wei D. Yuan
*Assistant Examiner* — Nga Leung V Law
(74) *Attorney, Agent, or Firm* — Chrisman Gallo Tochtrop LLC

(57) ABSTRACT

A method to stabilize position and shape of a plasma beam established between a cathode and an anode, where an electrical field is established between the cathode and the anode and where the shortest electrical field line between the cathode and the anode defines a reference line, wherein at least one oriented electromagnetic coil is provided and the at least one oriented electromagnetic coil has its coil axis oriented in a non-colinear manner to the reference line in such a way that at least one of the straight lines which are intersecting both of the coil openings and which are parallel to the coil axis intersects with the reference line and where a current is sent through the at least one oriented electro-
(Continued)

magnetic coil in order to establish a magnetic field which is used to deflect or attract the plasma beam.

19 Claims, 10 Drawing Sheets

(56)                    References Cited

U.S. PATENT DOCUMENTS

| | | | |
|---|---|---|---|
| 5,902,649 | A | 5/1999 | Karner et al. |
| 7,192,483 | B2 | 3/2007 | Franz et al. |
| 2004/0219294 | A1 | 11/2004 | Massler et al. |
| 2005/0016444 | A1* | 1/2005 | Franz .................... C23C 16/279 |
| | | | 117/68 |
| 2013/0034668 | A1* | 2/2013 | Sagisaka ............... C23C 14/325 |
| | | | 315/111.41 |

OTHER PUBLICATIONS

Karner et al., "High current d.c. arc (HCDCA) technique for diamond deposition", Diamond and Related Materials 5, (1996), pp. 217-220.
International Search Report and Written Opinion issued in Application No. PCT/EP2022/053164 dated Jun. 14, 2022.

* cited by examiner

ARC-BEAM POSITION MONITORING AND POSITION CONTROL IN PICVD COATING SYSTEMS

The present invention relates to a method to stabilize position and shape of a plasma beam, in particular in a plasma induced chemical vapor deposition process (PICVD process) as well as to a system being configured to carry out the method according to the invention, in particular in the form of an arc-beam PICVD coating system.

STATE OF THE ART

In order to make tools, especially precision tools and associated components, more corrosion-resistant and wear-resistant, it is known to apply diamond coatings on the surface of the tools. In order to create thin uniform layer structures, CVD processes are frequently used today, especially PICVD processes.

PICVD processes to produce diamond films on substrates are known from the literature, for example from documents U.S. Pat. No. 5,753,045, WO 03/031675 A2, U.S. Pat. Nos. 7,192,483, 5,902,649, "High current d.c. arc (HCDCA) technique for diamond deposition", J. Karner, M. Pedrazzini, C. Hollenstein, Diamond and Related Materials 5, (1996), 217-220 and Operating Manual BAI730D Diamond Coating System, BD 802 633 DE, 5$^{th}$ Edition, April 2004, page 20.

PICVD (plasma induced chemical vapor deposition) systems based on a DC-Plasma Arc-Beam generated with an electron emission source (cathode) and a collector (anode) are usually operated in a low pressure gas atmosphere typically in the range between 0.1 and 10 mbar. Possible gas mixtures for the generation of diamond films can comprise a noble gas like argon (Ar), hydrogen (H2) and a hydrocarbon gas. The hydrocarbon gas may be the source of carbon atoms for the carbon based films to be grown. Hydrogen may ensure the growth to be in diamond sp3 carbon bonding mode, and Ar may be necessary for operating the arc-beam plasma. A plasma-arc beam can be stabilized with a magnetic field with field lines forming a non-convoluted path from cathode to anode. For simplicity, the cathode and anode are often located on the base plane and the cover and therefore on opposite sides of a cylindric reactor such that the arc beam may form a straight column from cathode to anode as it is shown in FIGS. 1a and 1b illustrating a typical state of the art setup.

The magnetic field in PICVD processes is usually generated by a coil (or multiple coils 10) arranged in such a way that field lines 10a are essentially parallel to the axis from cathode to anode and the field strength is approximately homogeneous.

In the hot plasma of the arc beam, the hydrocarbon gas molecules are excited as well as atomic hydrogen is formed. These species may diffusely migrate to the parts located in distance from the arc beam. On the surfaces of the parts, these species can react to form a carbon film. For a properly chosen distance of the parts to the arc beam, the temperature conditions have to be met for the efficient growth of diamond films.

In a PICVD System, coating films are formed from the excited species condensing on any surfaces, wherein those species migrate in a diffusely manner in the coating system. Depending on the surface temperature, different type of condensing reactions occur and different type of coatings grow on the surfaces. In a system for making diamond-type coatings, sp3-type diamond film growth occurs in the presence of appropriate amounts of atomic hydrogen at surfaces with temperatures in the range of 700-900° C. Heated both by thermal radiation from the plasma of arc beam and by exothermal surface reactions, mainly of atomic hydrogen, those temperature conditions are met in a certain radial distance around the arc beam in the center of the system. At larger distances, temperatures are smaller and graphite type growth is favoured. In areas with lower temperatures, especially on water cooled system walls, polymeric-type film growth may be observed.

Disadvantageously, in PICVD processes for the generation of diamond films the diamond film growth rate on parts located at specific distances from the plasma arc beam critically depends on the distance from the center of the arc beam.

In a typical setup like shown in FIG. 1a, 1b the parts 1 to be coated are located at a fixed distance of about 120 mm distant from the arc-beam axis 9. In this setup, a relative diamond film thickness sensitivity of 3%-5% per millimeter distance variation from the arc-beam center axis is observed. In order to achieve a typically requested relative film thickness accuracy of <10%, the distance of the arc-beam to the parts must be within <2-3 mm, considering other influencing factors also affecting the film thickness. Since the arc-beam 9 is a diffuse column with a decreasing density from the beam central axis with a radial half-density-width of approximately 50 mm, unfortunately visually determining the effective distance of the parts to the beam axis is highly inaccurate or impossible with precision of a few millimetres.

Although the parts can be carefully arranged at a fixed distance to the geometrical axis of the coating system, defined by the center of the plasma electron source's aperture 7 and the conical shaped anode 8 on the opposite side of the system, the arc-beam axis may deviate from this geometrical axis. Both external magnetic field as well as electric fields from surface potentials of the fixtures in the plasma environment can cause some deflections of the arc beam 9 on its way from the cathode to the anode. For example, the magnetic fields of the high current wires connecting the anode and the cathode source to the power supply driving the arc current cause some noticeable deflections. Additionally, mechanical tolerances or slight geometric misalignment of the external coils 10 generating the axial magnetic field can cause some beam deflections.

In order to solve the above-mentioned problems, means have been used for maintaining a well centered arc beam. However, as already mentioned above, direct visual inspection of the arc beam position is ambiguous and inaccurate, since the arc beam is a diffuse column with a gradual decrease in brightness from the center. Visually determining the position of the diffuse arc beam cannot be made better than typically ±1 cm. Centering the parts to a previously determined position to the arc beam may be done when the system is open, but accuracy might be not good enough, as described above. Adjusting the parts by some positioning mechanism of the fixtures that hold the parts may be imagined, however realizing such an in-situ mechanism would be highly demanding, given the fact that process temperatures are well above 500° C. Alternatively, the coils generating the axial magnetic field may be tilted to create a horizontal field component that initiates a deflection of the arc beam. But doing such adjustments is a tedious iterative task, since it would mean making several coating runs with successive measurements of the coating thickness on the parts. Moreover, with process drifts or systematic variations of arc beam position with process conditions makes an adjustment of coil tilting from process to process or even between different process steps demanding. Using motorized tilting means, this adjustments could be automized enabling remotely controlled beam deflection adjustments from process recipes.

Given the rapidly decreasing temperature with distance from the arc-beam axis in the system, simultaneously measuring the temperature at different angle position around the arc beam may also be used for determining the position of the arc beam column. Such a recipe for centering the arc-beam has been described in J. Karner, M. Pedrazzini, C. Hollenstein, Diamond and Related Materials 5, (1996), 217-220 and Operating Manual BAI730D Diamond Coating System, BD 802 633 DE, 5$^{th}$ Edition, April 2004. However, mandatory is a very accurate positioning of the temperature sensors, as well as maintaining an identical surface on all sensors. Those challenges can hardly be overcome a production type environment, given the fact that position accuracies of a only a few mm are demanded.

OBJECTIVE OF THE PRESENT INVENTION

It is therefore the object of the present invention to at least partially overcome the above-mentioned disadvantages of known PICVD processes to produce diamond films on substrates. In particular, it is the object of the invention to provide a method to stabilize the position and shape of a plasma beam, for a targeted, controllable application of diamond coatings in a simple, cost-effective and reliable way.

DESCRIPTION OF THE PRESENT INVENTION

Figure 1A:
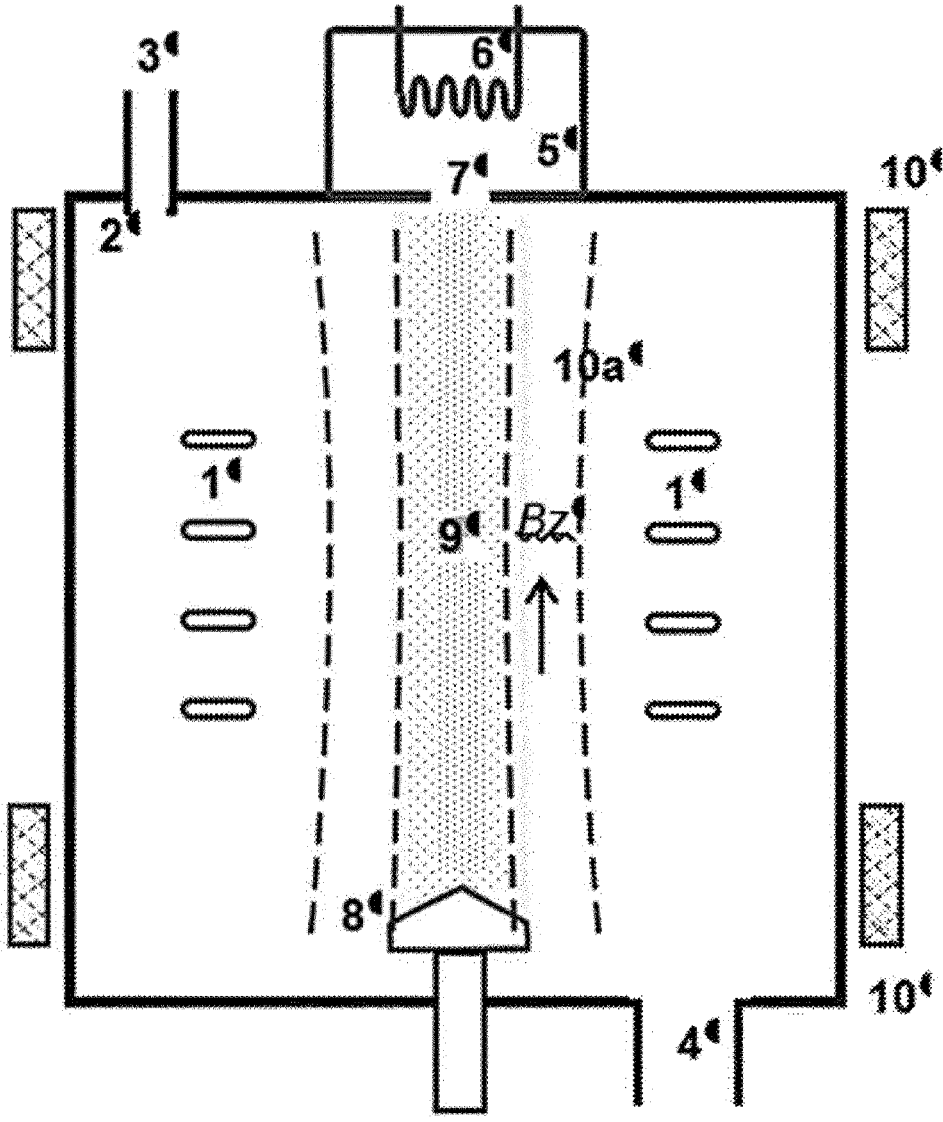
FIGS. 1a and 1b show a PICVD system.

The above-mentioned problem is solved by a method according to claim 1 and a system according to claim 15. Further features and details of the invention result from the respective subclaims, the description and drawings. Features and details described in connection with the method according to the invention are of course also valid in connection with the system according to the invention and vice versa, so that with regard to the disclosure of the individual aspects of the invention, reference is or can always be made mutually.

In this respect, according to a first aspect of the invention a method to stabilize position and shape of a plasma beam established between a cathode and an anode is disclosed, where an electrical field is established between the cathode and the anode and where the shortest electrical field line between the cathode and the anode defines a reference line, wherein at least one oriented electromagnetic coil is provided and the at least one oriented electromagnetic coil is with its coil axis oriented in a non-colinear manner to the reference line in such a way that at least one of the straight lines which are intersecting both of the coil openings and which are parallel to the coil axis intersects with the reference line and where a current is send through the at least one oriented electromagnetic coil in order to establish a magnetic field which is used to deflect or attract the plasma beam.

Thus, the core of the invention describes means for precise alignment of the arc beam position within the system to achieve equal coating thickness and composition within the PICVD system. This particularly comprises two key elements: a) remotely determining the actual beam position in the system, and b) adjusting the beam position within the system to compensate deviations. In case predetermined non-homogeneous coatings have to be produced it is understood that it is possible to intentionally maintaining a non-centered situation in the system.

The straight lines which are intersecting both of the coil openings and which are parallel to the coil axis intersecting with the reference line may be understood in particular as virtual straight lines running through the coil parallel to the coil axis.

With regard to an arrangement allowing clear determination and effective adjustment of the position of an arc beam, it can advantageously be provided that the non-colinear orientation is a perpendicular orientation.

Within the scope of a particularly precisely determinable and adjustable positioning of an arc beam in an easy and effective way at least one mirrored electromagnetic coil may be provided oriented and positioned with respect to the at least one oriented electromagnetic coil in a mirrored manner, wherein preferably the reference line being used as mirror axis, wherein the oriented and the mirrored electromagnetic coils forming a first pair of electromagnetic coils.

In the context of a particularly precisely determinable and adjustable positioning of an arc beam, it may also be provided that a second pair of electromagnetic coils may be provided and preferably may be arranged in such a manner that their coil axis is oriented in a non-collinear manner with the reference line in such a way that at least one of the straight lines which are intersecting the coil openings and which are parallel to the coil axis intersects with the reference line and the second pair is as well oriented in a non-colinear manner with the axis of the first pair of electromagnetic coils.

Here, it is particularly conceivable with regard to an exactly definable and adjustable positioning of an arc beam that the orientation of the second pair of electromagnetic coils may be perpendicular to the reference line and preferably perpendicular to the coil axis of the first pair of electromagnetic coils.

Likewise, it is conceivable with regard to a precisely definable and adjustable positioning of an arc beam that a magnetic field is generated by a coil or by two or more coils arranged in such a way that field lines are essentially parallel to the axis from cathode to anode and the field strength is approximately homogeneous.

With regard to an arrangement allowing clear determination and effective adjustment of the position of an arc beam, it can advantageously be provided that a set of coils producing magnetic fields Bx, By is provided, wherein the set of coils is arranged in such a way with respect to the reference line that the magnetic fields Bx, By are oriented perpendicular to an axial field Bz stabilizing the arc beam, wherein the magnetic fields Bx, By are preferably used to determine the arc beam position, wherein particularly a determination of the arc impedance is used for determination of the arc beam position.

In order to allow a continuous control of the arc beam during a coating process, it may advantageously be provided that a static position of the arc beam is extracted from a modulated voltage signal by using a demodulation technique, preferably by using a phase sensitive quadrature demodulation applied to the modulated voltage signal, wherein in particular both an amplitude and a phase delay to an imposed field modulation is detected.

With respect to a continuous control of the arc beam during a coating process it is also imaginable that an offset position of the arc beam can be expressed in coordinates x and y by a transformation from polar to cartesian coordinates, wherein preferably an amplitude provides a static offset position from a center alignment and a phase delay gives an angle direction of a misalignment of the arc beam.

In this respect, it can be equally beneficial, when a curvature of arc impedance paraboloid is used for specific process conditions to determine the positioning of the arc beam, wherein preferably uniaxial symmetry of the impedance paraboloid is assumed.

Furthermore, with regard to a continuous control of the arc beam during a coating process, it may advantageously be provided that static offset currents Isx and Isy are used for correction of the actual arc beam position, preferably by superimposing the static offset currents Isx and Isy to a coil modulation signal, wherein the arc beam is in particular centred by using the estimation that $Isx=-dIx$ and $Isy=-dIy$, wherein a check of the centering of the beam is indicated by a disappearance of the coil modulation signal.

In this respect, it can be equally beneficial, when a correction process for arc beam centering is iteratively repeated, wherein the iteration procedure is preferably automated as an on-line arc beam centering method which maintains the arc beam position in a centered position over time.

Within the scope of to a continuous control of the arc beam during a coating process it may also be conceivable that the curvature of arc impedance paraboloid is determined with manually testing the arc voltage for specific settings of the static offset currents Isx and Isy, wherein preferably the values of the curvature of arc impedance paraboloid are determined ahead of the process for each step.

Equally, it may be imaginable that intentionally non-equally coil modulation currents Imx and Imy are chosen for determination of the curvature required for determination of the beam position, wherein the curvature required for determination of the beam position is preferably simultaneously obtained for several steps of the previously mentioned determination procedure.

Finally, according to a second aspect of the invention, an arc-beam PICVD coating system for coating parts is disclosed, wherein the arc-beam PICVD coating system is configured to carry out the previously mentioned method.

Further advantages, features and details of the invention will be apparent from the following description, in which embodiments of the invention are described in detail with reference to the drawings. The features mentioned in the independent claims and in the corresponding parts of the description may be essential to the invention. Further features not included in the independent claims but mentioned in the dependent claims and in the corresponding parts of the description constitutes preferred embodiments of the invention individually or in any combination. The examples of the invention provided in the present description should not be understood as a limitation of the invention but as preferred embodiments or showcases of the present invention. The FIGS. 1c to 8 are used for facilitating understanding of the description of the invention.

DETAILED DESCRIPTION

Figure 1B:
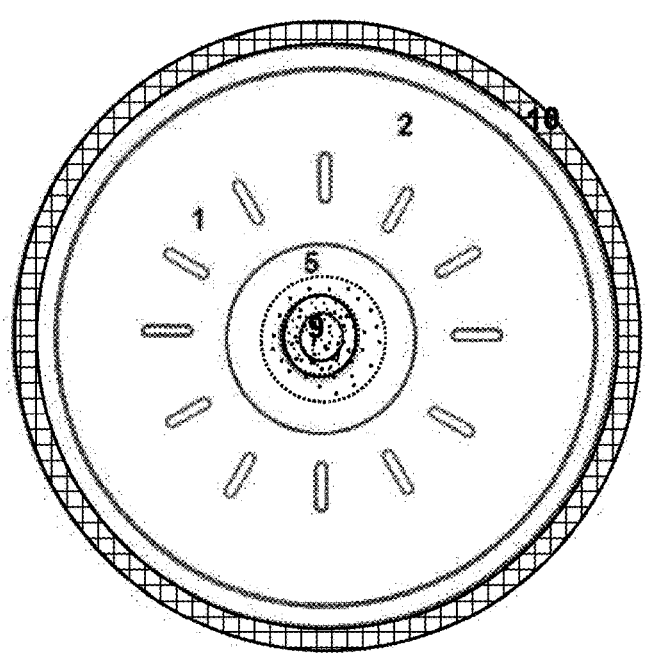
Figure 1C:
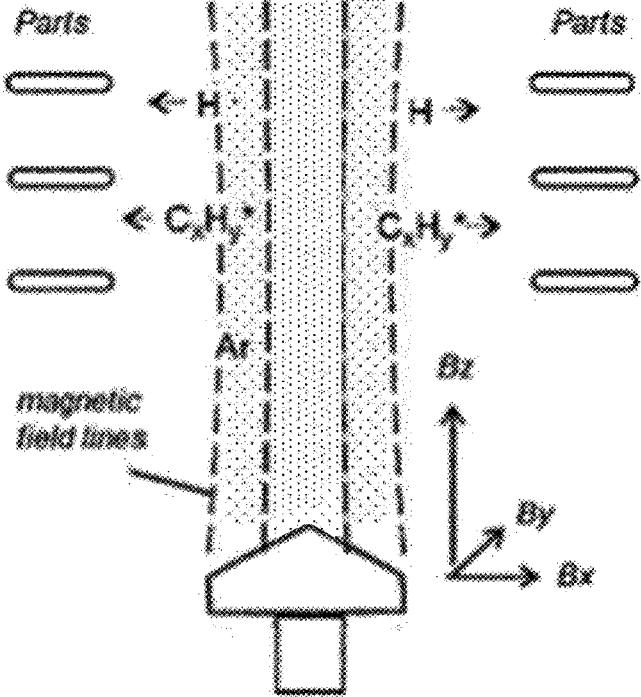
FIG. 1c shows a PICVD system setup according to the invention.

A PICVD System setup according to the invention is shown in FIG. 1c.

The two key elements of remotely determining the actual beam position in the system, and adjusting the beam position within the system to compensate deviations are addressed by a set of coils which produce magnetic fields Bx, By perpendicular to the axial field Bz for stabilizing the arc beam (FIG. 1c). By using 2 pairs of coils 10a,10b arranged with their axis preferably perpendicular in their directions, a magnetic field vector (Bx,By) in any direction non-linear to the and preferably perpendicular to the arc beam can be generated. The plasma electrons of the arc beam follow the magnetic field lines in passing from cathode to anode. By applying a (small compared to Bz) horizontal field in the system, the magnetic field lines from the axial coils are deflected and consequently the beam is deflected on their path between cathode and anode in the presence of such a horizontal field. With specific settings of the coil's currents generating a horizontal field component, beam defections in any horizontal direction can be obtained.

With setting and adjusting amount and direction of preferably static currents in the x,y-coils, any undesired beam deflection can be compensated and the beam can properly be brought to a centered position. Additionally, any off center beam position (within limits) can also be achieved by intentionally using appropriate coil currents to generate a static deflection field, for example in the case of parts to be coated that are not concentrically arranged with the system axis.

The horizontal magnetic fields (Bx,By) generated by the coils can also be utilized for determining the beam position, which is the second topic to be addressed, namely an arc beam position monitoring. When the arc beam is deflected with horizontal fields, the arc impedance (=arc voltage divided by arc current) increases, since the electrons migrating along the magnetic field lines must deviate from this path when approaching the vicinity of the anode to reach the anode surface.

With a small circular aperture cathode and a conical shaped anode, the system has an axial symmetry, and the impedance of the arc beam increases by the same amount independent of the horizontal direction of its deflection. Since the impedance has a minimum when the arc beam is fully aligned with the axial magnetic field, the impedance rises in first order approximation quadratically with the beam defection.

Figure 2A:
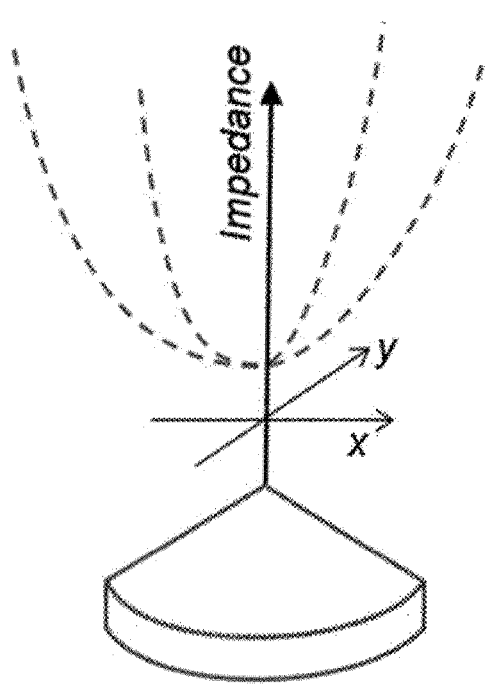
FIG. 2a shows an impedance map versus beam deflection defined by a conical anode tip.
Figure 2B:
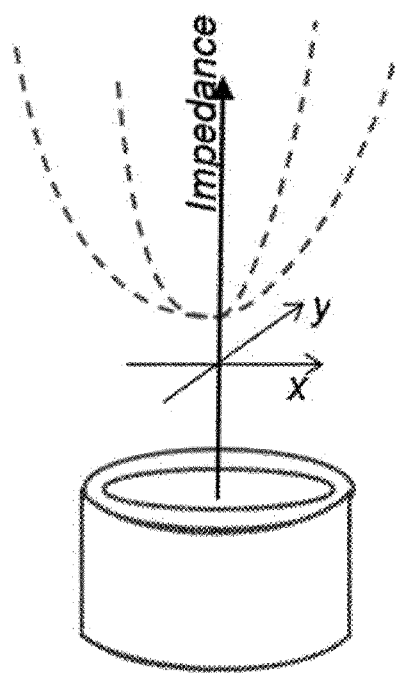
FIG. 2b shows an impedance map versus beam deflection defined by a cylindrical hollow anode tip.

Thus the impedance map versus beam deflection is a paraboloid with its minimum on the vertical axis defined by the conical anode tip (see FIG. 2a).

Alternative to the conical shaped anode, a cylindric hollow anode can also be used, which has a parabolic impedance dependency by its symmetry as well.

The variation of impedance with the arc beam (lateral) position can be used for determining the position of the arc beam. For the rest of this text, the arc beam impedance $R_{arc}$ is represented by the arc-beam voltage signal $V_{arc} = R_{arc} \cdot I_{arc}$, assuming the arc is driven by a constant current source.

By applying phase shifted current modulations in the x- and y-coils, a horizontal magnetic field component is generated that is dynamically rotating in the horizontal plane with a specific modulation frequency fm (modulation period Tp=1/fm). In the simplest case, the coils are perpendicularly arranged in the horizontal plane and denoted by x- and y-direction as shown in FIG. 1*b*. The coil current modulation to the first pair of coils (x-coils) can be chosen as a sine-function, with the modulation to the is second pair (y-coils) which can be chosen as a sine-function phase shifted by 90°.

Figure 3A:
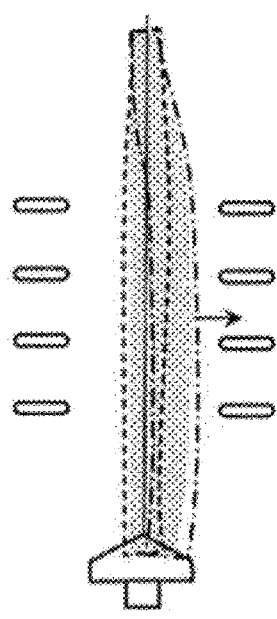
FIGS. 3a and 3b show motion of the arc beam.
Figure 3B:
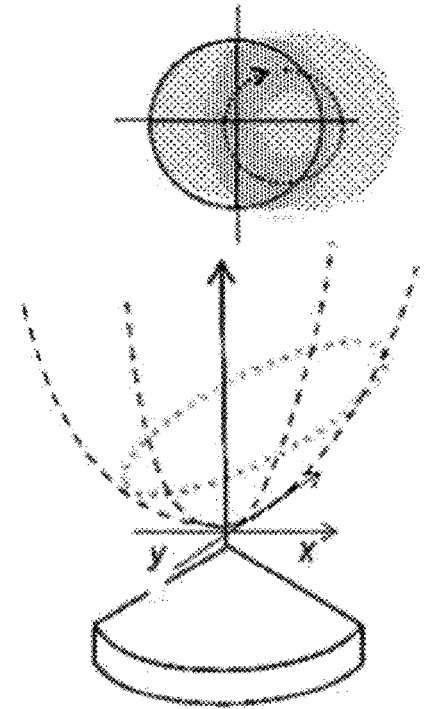
Figure 3C:
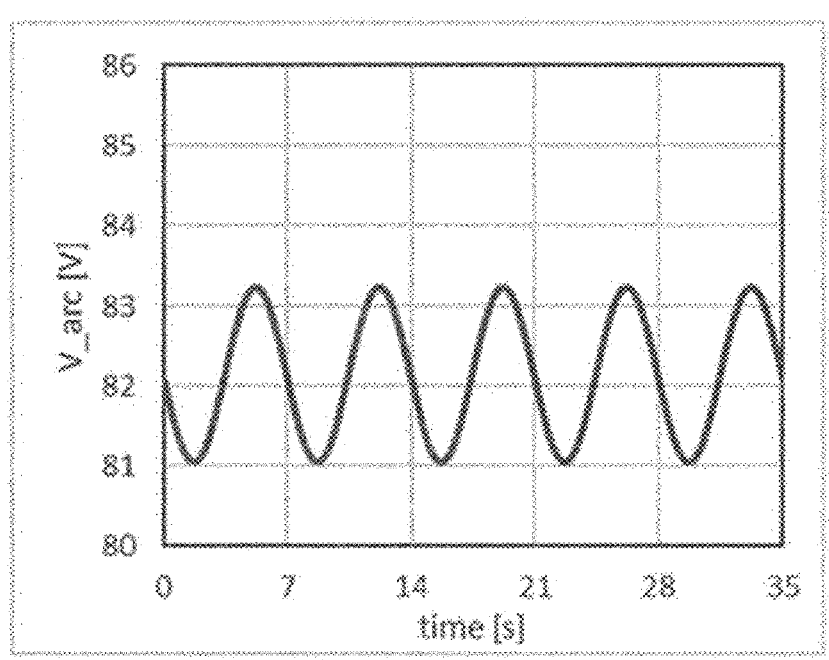
FIG. 3c shows modulation of the arc voltage.

The arc beam following this magnetic field component is moving on a correspondingly circular path about its static direction. The arc voltage (or impedance) is then affected by the motion of the arc beam. In the case of any misalignment of the arc beam w.r.t to the anode axis, the arc voltage gets modulated synchronously with the moving arc beam. On the impedance paraboloid, the corresponding path is a ellipse. FIGS. 3*a*, 3*b* and 3*c* summarizes the situation described above.

With proper deflection of the beam with superposed preferably static currents to the coils, the arc beam can be aligned with the anode axis, resulting in a disappearance of the modulation of the arc voltage. In this case, the beam moves on a circle at a fixed impedance value on the impedance paraboloid. This level depends on the modulation amplitudes alone. This absence of modulation signal in the arc voltage is the indicator that the arc beam is well centered.

During the course of one modulation period Tp, the coating rate on parts that are closer to the arc beam in the first half of the modulation period is momentarily larger than with the undeflected beam, in the second half of the period, the coating rate is correspondingly smaller. For a total coating process lasting much longer than this modulation period, the variation of the coating rate averages to the static thickness without beam modulation. As a typical example in PICVD processes for micrometer-thickness diamond coatings lasting up to several hours, typical modulation periods may be in the range of seconds to 10-seconds.

Figure 5:
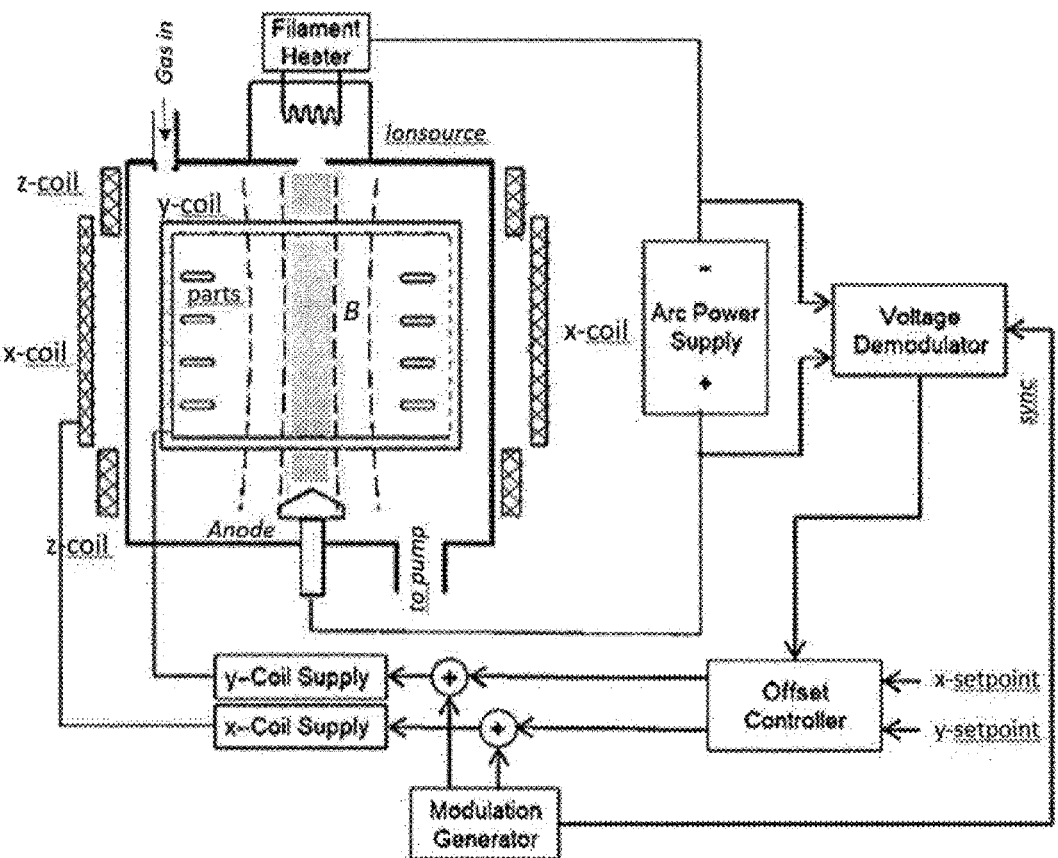
FIG. 5 shows a schematic implementation of demodulation.

The static position of the arc beam can be extracted from the modulated voltage signal as shown in FIG. 3*c* by using a demodulation technique. Specifically, with phase sensitive quadrature demodulation (also commonly called Lock-In technique) applied to the modulated voltage signal, both the amplitude and the phase delay to the imposed field modulation can be detected. FIG. 5 shows a schematic implementation of the demodulation. The amplitude provides the static offset position from the center alignment, the phase delay gives the angle direction of the misalignment of the beam. Equivalently, the offset position of the beam can be expressed in coordinates x and y by the usual transformation from polar to cartesian coordinates.

The modulation of the horizontal magnetic fields (Bx,By) by the coils is generated with the modulation of the coils currents according to $$Ix = Imx \cdot \cos(2 \cdot \pi \cdot f \cdot t)$$

$$Iy = Imy \cdot \sin(2 \cdot \pi \cdot f \cdot t)$$

where f is the modulation frequency and Imx and Imy the corresponding amplitudes of the x-coils and y-coils, and t is the time. With the synchronous harmonic (or 1f-) demodulation signals denoted by V cos and V sin, the static correction current to the x-coil and y-coils can be calculated by:

$$dIx = 2 \cdot A \cdot (V \cos \cdot \cos \varphi + V \sin \cdot \sin \varphi)/(c2 \cdot I \text{ arc} \cdot Imx)$$

$$dIy = 2 \cdot A \cdot (V \sin \cdot \cos \varphi - V \cos \cdot \sin \varphi)/(c2 \cdot I \text{ arc} \cdot Imy)$$

Where $\varphi$ is a modulation hardware and frequency dependent signal system phase shift, A is a correspondingly dependent amplitude factor from signal damping, c2 is the curvature of arc impedance paraboloid for specific process conditions. For simplicity, uniaxial symmetry of the impedance paraboloid is assumed. Using a previously determined sensitivity of the beam deflection on the coil current, which can be assumed to be linear with a slope parameter $p_{scal}$ that is both dependent of the coil arrangement and geometry as well as on the axial field strength Bz, the geometric beam position is then $$xb = p_{scal} \cdot dIx$$

$$yb = p_{scal} \cdot dIy$$

In order to correct the actual beam position, a static offset currents Isx and Isy must be superposed to the coil modulation signal $$Ix = Isx + Imx \cdot \cos(2 \cdot \pi \cdot f \cdot t)$$

$$Iy = Isy + Imy \cdot \sin(2 \cdot \pi \cdot f \cdot t)$$

Figure 4A:
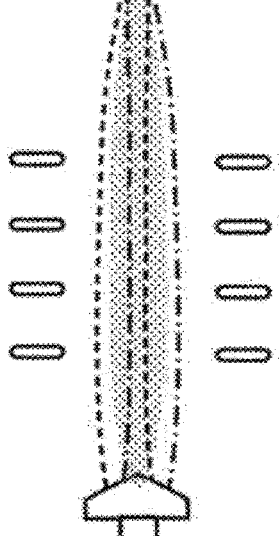
FIGS. 4a and 4b show rotation of the arc beam.
Figure 4B:
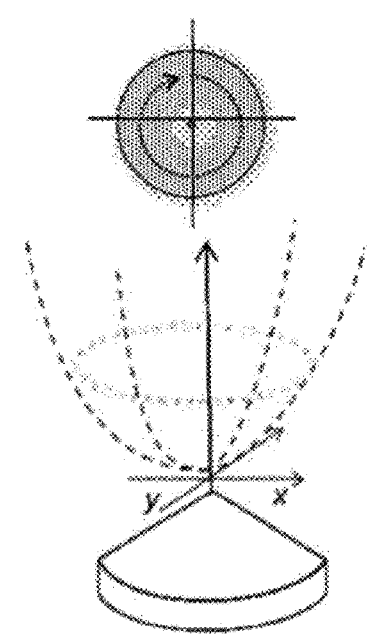
Figure 4:
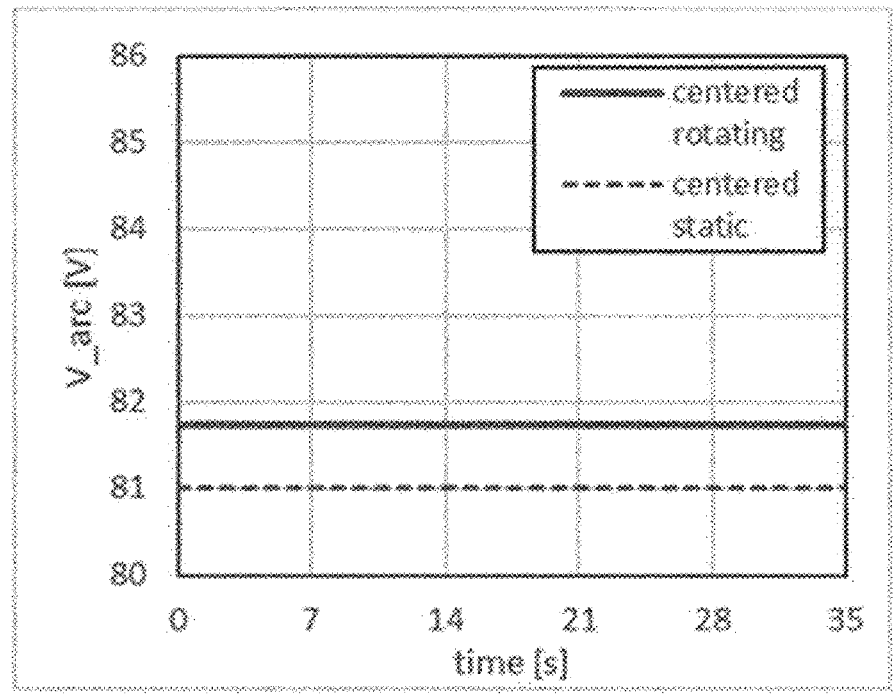
FIG. 4c shows the arc voltage.

With Isx=−dIx and Isy=−dIy, the beam can be centered, which is characterized by the disappearing modulation signal of the arc voltage, as depicted in FIG. 4*c*. The arc beam rotates about the center position shown in FIG. 4*a*, the arc voltage is constant at the level given by the impedance times the arc current.

In reality, any other imposed or intrinsic fluctuations of voltage signal are suppressed in demodulation but may still result in fluctuations of the correction values dIx and dIy. The correction process for arc beam centering may be iteratively repeated according to $$Isx_{n+1} = Isx_n - dIx_n$$

$$Isy_{n+1} = Isy_n - dIy_n$$

where $Isx_n$ and $Isy_n$ are previous settings of static currents applied to the x- and y-coils, and $dIx_n$ and $dIy_n$ are the correction currents obtained in the $n^{th}$ iteration step. With the position sensitivities of the beam to the coil currents $p_{scal}$, the arc beam position is iteratively corrected according to $$xc_{n+1} = xc_n - dIx_n/p_{scal}$$

$$yc_{n+1} = yc_n - dIy_n/p_{scal}$$

The sequences of $(xc_n, yc_n)$ represent the arc beam position after each update of the beam position with corrections $dIx_n$ and $dIy_n$.

This iteration procedure may be automated as an on-line arc beam centering method which maintains the arc beam position in a centered position over time. Those can originate form changes in process conditions during a more complex process recipe sequence of process steps which affect the arc beam position.

So far, it was assumed that the arc beam should be centered about the system axis to achieve equal coating uniformity about this axis. However, this can be considered as a special case of maintaining the arc beam at the predefined position. Adding specified offset currents Ipx and Ipy to the x- and y-coils the arc beam is deflected by a fixed amount $\Delta x = Ipx/p_{scal}$ and $\Delta y = Ipy/p_{scal}$ from the position without these currents.

For an ideally centered arc beam, the arc-beam is then at position $(xp,yp)=(\Delta x,\Delta y)$. The demodulation method then detects this shift in arc-beam position as new correction currents dIx and dIy, which contain the amounts Ipx and Ipy. The iteration formulas for successively correcting the arc beam position is then $$Isx_{n+1}=Isx_n-(dIx_n-Ipx)$$

$$Isy_{n+1}=Isy_n-(dIy_n-Ipy)$$

For the arc-beam position, this translates into $$xp_{n+1}=xp_n-(dIx_n-Ipx)/p_{scal}$$

$$yp_{n+1}=yp_n-(dIy_n-Ipy)/p_{scal}$$

The arc-beam then iteratively fluctuates about the desired position (xp,yp).

The curvature c2 of arc impedance paraboloid may be determined with manually testing the arc voltage for specific settings of the Isx and Isy. In more complex processes comprising of several steps with different process parameters, the shape of the paraboloid might change, and the c2 values must be determined ahead of the process for each step.

Avoiding this determination of c2 would be desired by a method that does this automatically for given process conditions.

Using the already applied modulation of the coils, the arc voltage signal is also fed into a 2f-demodulation scheme. Denoting the 2f-demodulation quadrature signals as V cos 2 and V sin 2, and still assuming the rotationally symmetric impedance paraboloid, c2 can then be obtained as $$c2=8\cdot((V \cos 2)^2+(V \sin 2)^2)^{0.5}/(Imx^2-Imy^2)$$

Figure 6A:
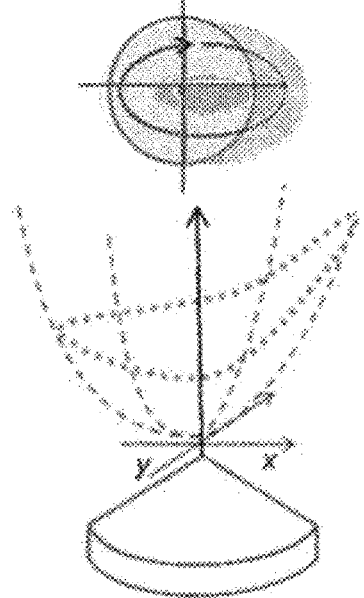
FIG. 6a shows elliptical motion of the arc beam.
Figure 6B:
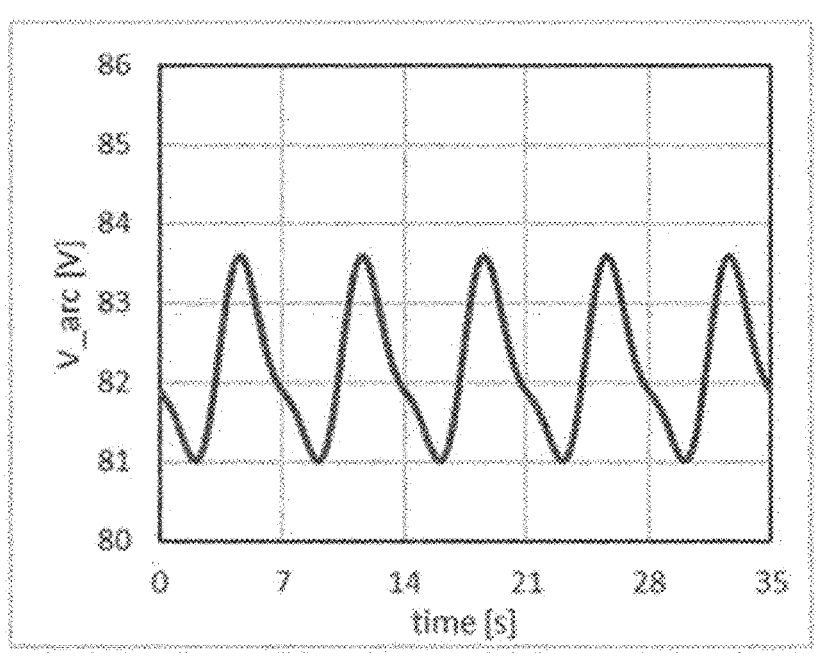
FIG. 6b shows modulation of the arc voltage.
Figure 6C:
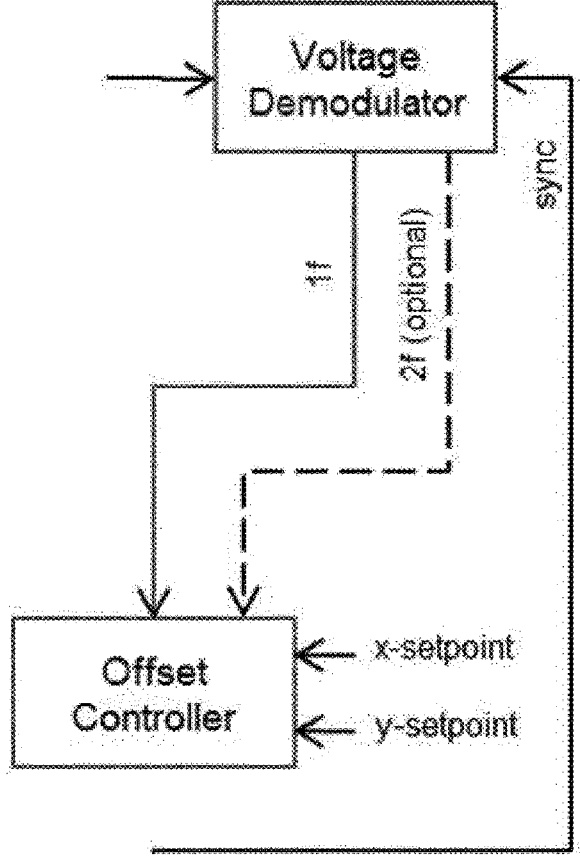
FIG. 6c shows demodulation signals fed to an offset controller.

Thus, for intentionally non-equally chosen coil modulation currents Imx and Imy, the curvature required for the determination of the beam position can simultaneously obtained for each step in the above described method for automatic correction of the beam position. In this case of non-equal chosen coil modulation currents Imx and Imy, the arc beam circulates on a elliptic path about the center position, as depicted in FIG. 6a. The arc voltage modulation consists of both of a 1f and a 2f component (FIG. 6b). FIG. 6c schematically shows the additional 2f-demodulation signals fed into the offset controller providing the actual value of c2.

Alternatively, the curvature of the arc impedance paraboloid can also be obtained from the arc voltage V0 without any perpendicular magnetic fields deflecting the arc beam, and the time-averaged arc voltage $V_{avg}$ over many periods of the modulated horizontal magnetic fields (Bx,By), e.g. the same number of periods as used for generating the demodulation V cos and V sin. With the paraboloid formula for the arc voltage dependent on the currents Ix and Iy to the horizontal coils $V=V0+0.5\cdot c2\cdot(Ix^2+Iy^2)$, the time averaged voltage can be calculated for an averaging over a fixed number of modulation periods with fixed currents Isx and Isy, and the sinusoidal modulation amplitudes Imx and Imy as $$c2=2\cdot(V_{avg}-V0)/(Isx^2+Isy^2+0.5\cdot(Imx^2+Imy^2))$$

In this way, the necessary parameter c2 for obtaining the demodulation signals and the arc beam positions can be simultaneously obtained, which is an advantage if this parameter might change over the duration of the coating process.

The invention will now be described on the basis of a specific example.

In a typical arrangement of a PICVD system for diamond coatings like described in [1]-[5], beam deflection sensitivity w.r.t. coil currents are about 2 mm/A, as both observed from visual defection experiments with larger currents, and from field line calculations for the considered geometry. In our example the axial magnetic field Bz was 10 mT, and the horizontal field generated by the coils at the location of the arc beam was about 0.1 mT per ampere coil current.

The dependence of the arc voltage to the coil current has been observed with static deflections to be approximately $c2=0.3$ $V/A^2$. With intrinsic voltage fluctuations on level of a few 10 mV from various other sources for a demodulation of voltage signal traces of 10 modulation periods, the position accuracy with a deflection sensitivity of 2 mm/A is in the range of less than 1 mm, below the level typically demanded to achieve a coating thickness deviation of less than 10%. Using longer lasting traces for the demodulation, better position accuracy could be achieved, however it takes also longer to obtain the position values.

The above described situation is a special case of arrangement and modulation-demodulation scheme. In general, the x- and y-coils do not need to be perpendicular to each other for generating a rotating horizontal magnetic field component that deflects the beam. In this case, the modulation amplitudes and the phase must be adapted and this must correctly be considered in the demodulation scheme, making the formulas for obtaining the beam center positions more complex. Additionally, the modulations signal of y-coil does not have to be in sin-function form, it can also have the more general form $\cos(2*pi*f*t+\delta)$, with $\delta\neq\pi$. In this case, there is a 2f component of the arc voltage also with equal modulation amplitudes Imx and Imy applied on the x- and y-coils. As with the previous generalization, the formulas for the obtaining the beam positions become more complex.

For some special cases, it might be desirable not to have cos- or sin-type modulation functions. The modulation-demodulation scheme can equally applied to this case, but again, the correct formulas for detecting and correcting arc-beam center or position offsets become more complicated.

In the example as described two pairs of coils (x-coils and y-coils) were used in order to deflect the plasma beam. It should be noted however that the number of coil pairs can be increased. One possibility would be to have 3 or 4 or N pairs of coils kind of "surrounding" the plasma arc beam.

The generation of the magnetic field perpendicular to the arc beams can also be done with more than 2 pairs of coils. This can make sense if, for example, the arrangement of the 2 pairs has some geometric or other unwanted limitations. Then the wave functions of the currents to the coils must be adapted accordingly beyond simple trigonometric sin and cos functions.

Figures 7A, 7B:
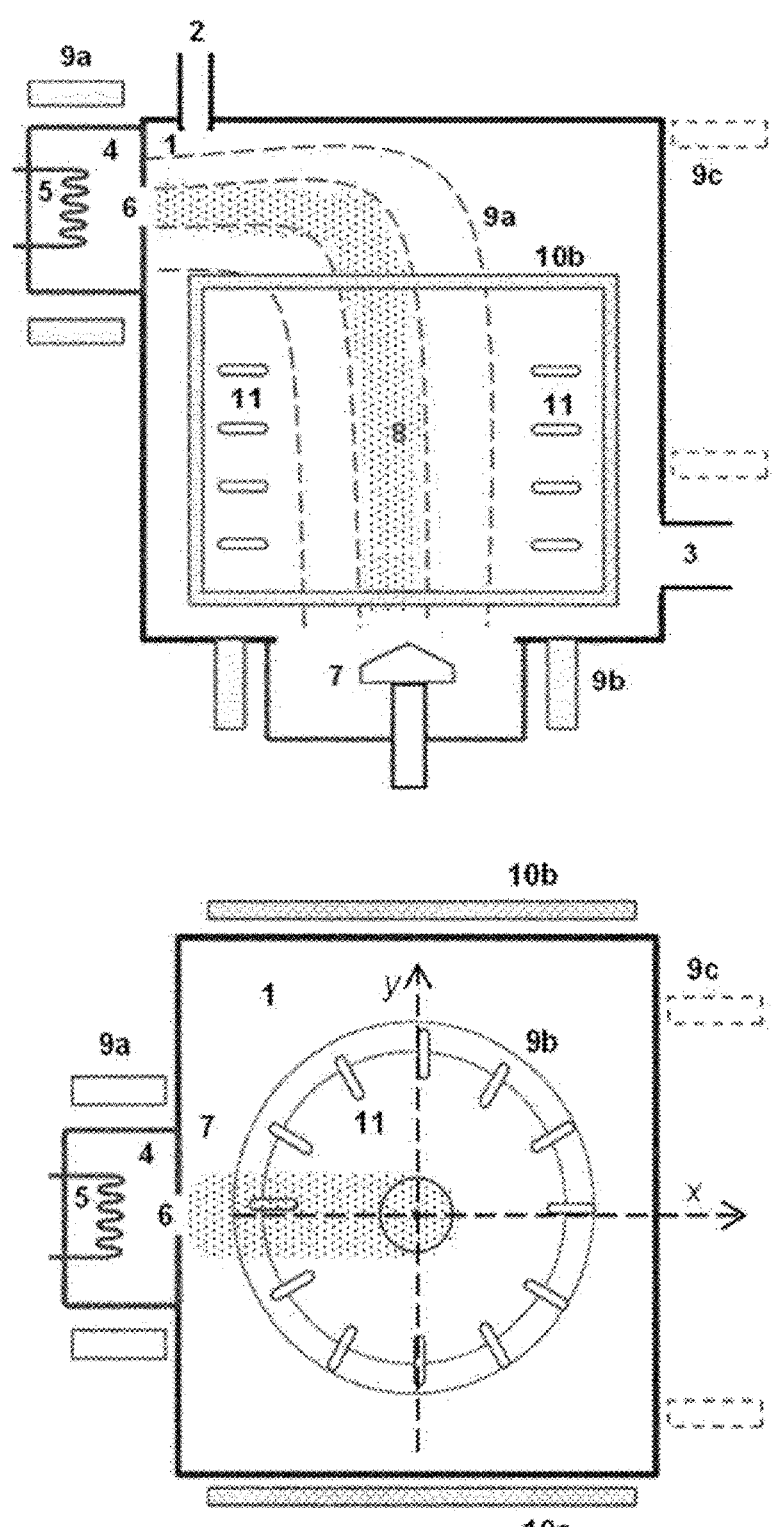
FIGS. 7a and 7b show an alternative system configuration.

In the system considered so far as depicted in FIG. 1a and FIG. 1b, the cathode and anode are arranged on opposite sides of the system. The invention can be extended to system configurations as shown in FIGS. 7a and 7b. The cathode is located on a side of the system rotated in its emission direction with respect to the anode located at the bottom of the system and the arc beam forms a bent column from cathode to anode. With proper choice of field strength both from coil 9a at the cathode and coil 9 at the anode defined be the corresponding coil currents, the arc beam path can be tailored and stabilized such that it extends from the cathode on a horizontal path, then bends towards the anode in a rather short path and finally goes in an almost straight vertical path to the anode.

By proper modulation of both the currents to coil 9a and coil 9, the arc beam can be deflected in x-direction forth and back. With an optional coil 9b an additional magnetic field can be generated to extend and simplify the motion of the arc beam in x-direction. The deflection of the arc beam in y-direction can be achieved with a pair of coils 10b as in the system described in previous FIGS. 1a and 1b, By synchronized modulations both of the currents to coils 9a, 9, and optional coil 9b with currents to coils 10b, a closed path of arc beam motion can be generated, ideally in an elliptic or even circular path, and the same demodulation techniques can be applied to determine the arc beam position as described above.

Figure 8:
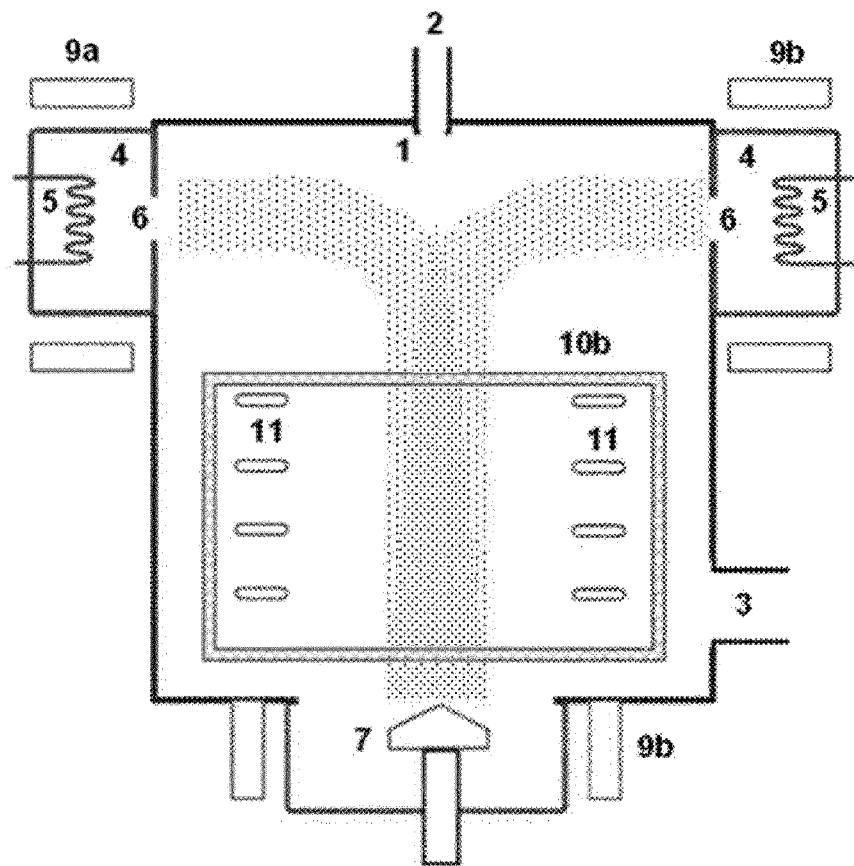
FIG. 8 show a configuration with an additional cathode source.

The system described in FIGS. 7a and 7b can additionally be extended by an additional cathode source that is located on the opposite side of the system on the same level, as shown in FIG. 8.

This might become necessary if the arc beam current should be increased beyond the limit of one cathode source. This cathode source again is equipped with a coil 9b generating the magnetic field for this source. Now, the field from coils 9a, 9b and 9 generate the magnetic field for stabilizing the arc beam, and the modulation scheme is for deflecting the must include all the currents to the corresponding coils. In such a system with more than one arc beam, mutual interactions between the arc beams must be considered because the arc beam's own magnetic fields causes an interaction with the other arc beam. Controlling multiple arc beams obviously might result in more complicated current controls to the individual coils for guiding and stabilizing the combined arc beams to the common anode.

In the same manner, the system could further be extended with additional cathode sources located on perpendicular sides of the system if even more arc beam current is required. In such a system, coils 10b for deflecting the beam in y-direction might not be used anymore, the coils of these additional sources may be used for this purpose.

The invention claimed is:

1. A method for stabilizing a position and a shape of a plasma beam established between a cathode and an anode, the method comprising the steps of:

establishing an electrical field between the cathode and the anode, wherein a shortest electrical field line between the cathode and the anode defines a reference line, wherein at least one oriented electromagnetic coil is provided, wherein the at least one oriented electromagnetic coil has a coil axis oriented in a non-colinear manner to the reference line in such a way that at least one straight line which intersects a coil opening of the at least one oriented electromagnetic coil and which is parallel to the coil axis intersects with the reference line;

sending a current through the at least one oriented electromagnetic coil;

producing by a set of coils magnetic fields Bx, By configured to deflect or attract the plasma beam, wherein the magnetic fields Bx, By are oriented perpendicular to an axial magnetic field Bz thereby stabilizing the plasma beam; and using the magnetic fields Bx By and a determination of an arc impedance to determine a plasma beam position.

2. The method according to claim 1, wherein the non-colinear orientation is a perpendicular orientation.

3. The method according to claim 1, further Including providing at least one mirrored electromagnetic coil oriented and positioned with respect to the at least one oriented electromagnetic coil in a mirrored manner, the reference line being used as mirror axis, the at least one oriented electromagnetic coil and the mirrored electromagnetic coil forming a first pair of electromagnetic coils.

4. The method according to claim 3, further including providing a second pair of electromagnetic coils arranged in such a manner that their coil axis is oriented in a non-collinear manner with the reference line, wherein the coil axis of the second pair of electromagnetic coils intersect the reference line and the second pair of electromagnetic coils is oriented in a non-colinear manner with an axis of the first pair of electromagnetic coils.

5. The method according to claim 4, wherein the coil axis of the second pair of electromagnetic coils is perpendicular to the reference line.

6. The method according to claim 1, further including arranging the magnetic fields so that field lines are parallel to the coil axis from the cathode to the anode and a field strength is approximately homogeneous.

7. The method according to claim 1, further including extracting a static position of the plasma beam from a modulated voltage signal using a demodulation technique.

8. The method according to claim 1, further including offsetting a position of the are plasma beam can be expressed in coordinates x and y by a transformation from polar to cartesian coordinates.

9. The method according to claim 1, further including determining the position of the plasma beam in view of a curvature of an arc impedance paraboloid.

10. The method according to claim 1, further including using static offset currents Isx and Isy for correction of an actual are plasma beam position.

11. The method according to claim 1, further including iteratively repeating wherein a correction process for plasma beam centering.

12. The method according to claim 9, further including determining the curvature of the arc impedance paraboloid by manually testing an arc voltage for static offset currents Isx and Isy.

13. The method according to claim 12, further including choosing intentionally non-equal coil modulation currents Imx and Imy corresponding to the first and second pair of electromagnetic coils for determining the curvature required for determination of the beam position.

14. The method according to claim 13, further including assuming uniaxial symmetry of the impedance paraboloid, determining the values of the curvature of arc impedance paraboloid ahead of the process for each step, and obtaining the curvature required for determining the beam position.

15. The method according to claim 5, wherein an orientation of the coil axis of the second pair of electromagnetic coils is perpendicular to the coil axis of the first pair of electromagnetic coils.

16. The method according to claim 1, further including extracting a static position of the plasma beam from a modulated voltage signal using a phase sensitive quadrature demodulation applied to the modulated voltage signal, wherein both an amplitude and a phase delay to an imposed field modulation is detected.

17. The method according to claim 8, wherein an amplitude provides a static offset position from a center alignment and a phase delay gives an angle direction of a misalignment of the arc beam.

18. The method according to claim 1, further including using static offset currents Isx and Isy for correction of an actual arc plasma position by superimposing the static offset currents Isx and Isy to a coil modulation signal, and wherein the arc beam is centered by using the estimation that Isx=−dIx and Isy=−dIy, wherein a check of the centering of the beam is indicated by a disappearance of the coil modulation signal.

19. The method according to claim 11, wherein the iteration procedure is automated as an on-line plasma beam centering method which maintains the plasma beam position in a centered position over time.

*    *    *    *    *